United States Patent
Passlack

(10) Patent No.: US 7,119,381 B2
(45) Date of Patent: Oct. 10, 2006

(54) COMPLEMENTARY METAL-OXIDE-SEMICONDUCTOR FIELD EFFECT TRANSISTOR STRUCTURE HAVING ION IMPLANT IN ONLY ONE OF THE COMPLEMENTARY DEVICES

(75) Inventor: Matthias Passlack, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 3 days.

(21) Appl. No.: 10/903,784

(22) Filed: Jul. 30, 2004

(65) Prior Publication Data

US 2006/0022217 A1    Feb. 2, 2006

(51) Int. Cl.
*H01L 21/00* (2006.01)

(52) U.S. Cl. .................. 257/192; 257/369; 438/199

(58) Field of Classification Search ............... 267/192, 267/369; 438/199
See application file for complete search history.

(56) References Cited

U.S. PATENT DOCUMENTS

| | | | |
|---|---|---|---|
| 3,983,620 A * | 10/1976 | Spadea | ............ 438/218 |
| 4,729,000 A | 3/1988 | Abrokwah | |
| 4,746,627 A | 5/1988 | Zuleeg | |
| 4,814,851 A | 3/1989 | Abrokwah et al. | |
| 5,060,031 A | 10/1991 | Abrokwah et al. | |
| 5,223,724 A * | 6/1993 | Green, Jr. | ............ 257/194 |
| 5,945,718 A | 8/1999 | Passlack et al. | |
| 2004/0137673 A1* | 7/2004 | Passlack et al. | ............ 438/197 |

\* cited by examiner

*Primary Examiner*—Thomas L. Dickey
(74) *Attorney, Agent, or Firm*—Ingrassia, Fisher &Lorenz

(57) ABSTRACT

A complementary metal-oxide-semiconductor field effect transistor structure includes ion implants in only one of the two complementary devices. The transistor structure generally includes a compound semiconductor substrate and an epitaxial layer structure that includes one or more donor layers that establish a conductivity type for the epitaxial layer structure. The ion implants function to "invert" or "reverse" the conductivity type of the epitaxial layer structure in one of the complementary devices. In the example embodiment, p-type acceptor implants are utilized in the p-channel device, while the n-channel device remains implant-free.

21 Claims, 1 Drawing Sheet

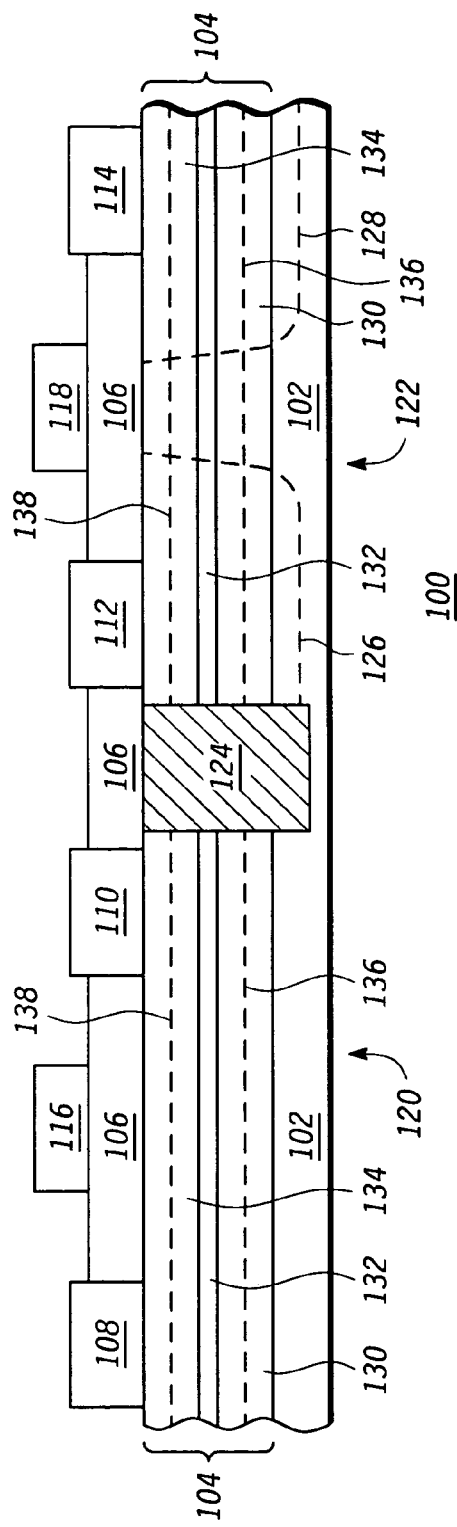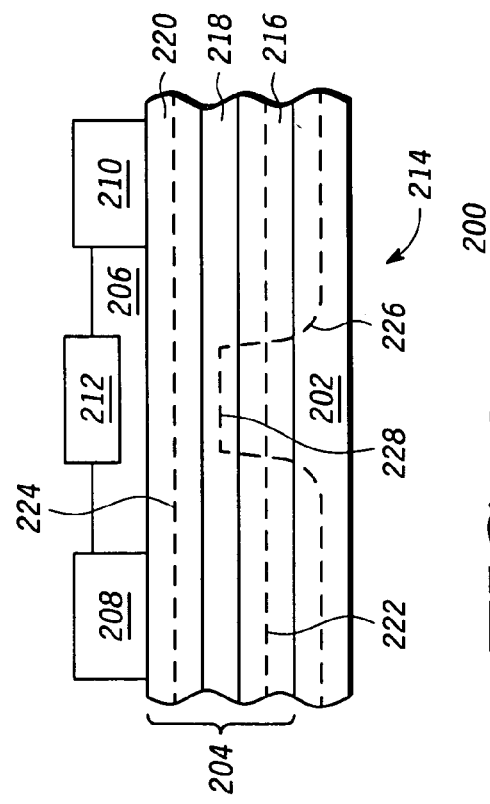

ary metal-oxide-semiconductor FET structure uses ion implants for only one type of device (either the n-channel or the p-channel device). Using this structure, sheet resistivity of 100 Ohm/square and below is achievable within a practical thermal budget, which allows for high performance devices, particularly at short gate lengths.

COMPLEMENTARY METAL-OXIDE-SEMICONDUCTOR FIELD EFFECT TRANSISTOR STRUCTURE HAVING ION IMPLANT IN ONLY ONE OF THE COMPLEMENTARY DEVICES

TECHNICAL FIELD

The present invention generally relates to semiconductor devices and, more particularly, to complementary metal-oxide-semiconductor field effect transistors.

BACKGROUND

The prior art is replete with different complementary metal-oxide-semiconductor field effect transistor (MOSFET) technologies. For example, enhancement mode metal-oxide-semiconductor field effect transistors (EMOSFETs) on compound semiconductors can employ standard-refractory metal gates with a metal work function of about 4.6 eV, an undoped channel to provide enhancement mode operation (positive and negative threshold voltage for n-channel and p-channel devices, respectively), and self-aligned ion implants to form low resistivity source and drain extensions and Ohmic contact regions. However, only p-channel EMOSFETs have been successfully fabricated on the compound semiconductor GaAs in the past. For n-channel EMOSFETs on GaAs, the implant activation temperature for donors of >700° C. is incompatible with $Ga_2O_3$—GaAs interface stability. The $Ga_2O_3$—GaAs interface can only be preserved for temperatures $\leq 700°$ C. and this interface is completely destroyed for temperatures above 700° C. during activation anneal of donor implants.

The prior art also includes compound EMOSFET technology using standard metal gates with a metal work function of about 4.3 to 4.6 eV, a channel doped to opposite conductivity type by ion implantation to provide enhancement mode operation (e.g., positive threshold voltage for n-channel devices) and ion implants to form low resistivity source and drain extensions and Ohmic contact regions. Since the n-type implants are annealed prior to gate oxide deposition, the oxide-GaAs interface is not affected by high temperature during implant activation. However, the subsequent gate oxide deposition is inevitably conducted on an exposed semiconductor surface, which leads to a high defect density at the oxide-semiconductor interface. The high defect density only allows the fabrication of devices with about 1% of anticipated performance, rendering the devices essentially useless.

Accordingly, it would be desirable to have a high performance complementary semiconductor FET technology that is compatible with gate oxide technology. Furthermore, other desirable features and characteristics of the invention will become apparent from the subsequent detailed description and the appended claims, taken in conjunction with the accompanying drawings and the foregoing technical field and background.

BRIEF SUMMARY

In accordance with one practical embodiment, a complementary metal-oxide-semiconductor FET structure uses ion implants for only one type of device (either the n-channel or the p-channel device). Using this structure, sheet resistivity of 100 Ohm/square and below is achievable within a practical thermal budget, which allows for high performance devices, particularly at short gate lengths.

Certain aspects of the invention may be carried out in one form by a complementary metal-oxide-compound semiconductor field effect transistor structure having a compound semiconductor substrate, an n-channel device formed on the substrate, a p-channel device formed on the substrate, and ion implants located in only one of the devices.

BRIEF DESCRIPTION OF THE DRAWINGS

The present invention will hereinafter be described in conjunction with the following drawing figures, wherein like numerals denote like elements, and FIG. 1 is a simplified cross sectional view of a complementary metal-oxide-compound semiconductor field effect transistor structure; and FIG. 2 is a simplified cross sectional view of a metal-oxide-compound semiconductor field effect transistor.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIG. 1 is a cross sectional view of a complementary metal-oxide-compound semiconductor field effect transistor structure 100 configured in accordance with an example embodiment of the invention. Transistor structure 100 generally includes a semiconductor substrate 102, an epitaxial layer structure 104 formed on semiconductor substrate 102, a gate oxide layer 106, Ohmic contacts (identified by reference numbers 108, 110, 112, and 114), and gate electrodes (identified by reference numbers 116 and 118). In one embodiment of the invention, semiconductor substrate 102 is a compound semiconductor substrate. Transistor structure 100 includes two complementary devices: an n-channel device 120 formed on semiconductor substrate 102 and a p-channel device 122 formed on semiconductor substrate 102. Device isolation is achieved using known techniques, e.g., by way of an oxygen implant 124. Transistor structure 100 utilizes ion implants in only one of the two devices, i.e., in either n-channel device 120 or p-channel device 122, but not both. In the illustrated embodiment, ion implants (identified by reference numbers 126 and 128) are located in p-channel device 122, while n-channel device 120 remains implant-free.

More particularly, semiconductor substrate 102 is formed from a compound III-V material such as GaAs. The use of III-V materials in semiconductor device manufacturing is well known and, therefore, the properties and characteristics of such materials will not be described in detail herein. Epitaxial layer structure 104 is grown, layer by layer, on compound semiconductor substrate 102 to form a compound semiconductor wafer structure upon which the devices reside. In the illustrated embodiment, epitaxial layer structure 104 includes a buffer layer 130 formed on compound semiconductor substrate 102, a channel layer 132 formed on buffer layer 130, and a spacer layer 134 formed on channel layer 132. In practical embodiments, gate oxide layer 106 is deposited on spacer layer 134 and can be formed from any suitable material, such as $Ga_2O_3$ using conventional techniques. The upper surface of gate oxide layer 106 is the upper surface of the wafer structure. Although a typical epitaxial layer structure 104 is shown in FIG. 1, alternative arrangements may be employed in practice.

Each of the individual layers of epitaxial layer structure 104 are epitaxially grown using known techniques and processes. In this regard, buffer layer 130 (which may be formed from any suitable III-V material, such as GaAs) is epitaxially grown on compound semiconductor substrate 102, channel layer 132 (which may be formed from any suitable III-V material, such as $In_xGa_{1-x}As$) is epitaxially grown on buffer layer 130, and spacer layer 134 (which may be formed from any suitable III-V material, such as $Al_xGa_{1-x}As$) is epitaxially grown on channel layer 132. The thickness of each layer is selected according to the desired device characteristics and, therefore, can vary from one application to another.

Transistor structure 100 also includes at least one dopant layer formed within epitaxial layer structure 104. The dopant layer can either comprise donor atoms (providing n-type conductivity) or acceptor atoms (providing p-type conductivity). Donor atoms are preferred for compound semiconductor implementations. FIG. 1 depicts a first donor layer 136 formed within buffer layer 130 and a second donor layer 138 formed within spacer layer 134. In practice, donor layers may be realized above, below, and/or within channel layer 132 (typical devices utilize one or two donor layers, and donor layers within channel layer 132 are unusual). Each donor layer 136/138 is a silicon monolayer that is grown over the compound semiconductor substrate 102. Briefly, a portion of buffer layer 130 is grown, donor layer 136 is grown on the first portion, then another portion of buffer layer 130 is grown on donor layer 136. A similar technique is used to grow spacer layer 134 and donor layer 138. The at least one donor layer establishes a natural conductivity type for epitaxial layer structure 104. In the example embodiment, donor layers 136/138 establish an n-type conductivity type for epitaxial layer structure 104.

As mentioned above, ion implants 126/128 are introduced into only one of the two complementary devices. In the example embodiment, ion implants 126/128 are realized as p-type acceptor implants located in p-channel device 122, while n-channel device 120 remains implant-free. An alternate embodiment (not shown) can utilize acceptor atoms for layers 136/138, donor implants located in the n-channel device, while the p-channel device remains implant-free. The ion implants 126/128 serve to "invert" or "reverse" the natural conductivity type of the epitaxial layer structure 104. For example, in the case of acceptor implants, this conductivity inversion occurs because the ionized acceptor concentration of the implant 126/128 exceeds the ionized donor concentration provided by the donor layers 136/138. In this example, ion implants 126/128 invert the n-type conductivity of epitaxial layer structure 104 to form the p-channel device 122. As shown in FIG. 1, ion implants 126/128 are preferably located under the respective Ohmic contacts 112/114, as well as in the source and drain extensions, and a channel implant need not be employed. In an alternate embodiment, a channel implant could be implemented as a means for adjusting the threshold voltage of the device.

Gate electrodes 116/118 are formed on gate oxide layer 106 to provide electrical gate contacts for the devices. In the preferred embodiment, gate electrode 116 is formed from a metallic material having a high work function. Suitable materials for a high work function gate electrode 116 include, without limitation, platinum and iridium. Ohmic contacts 108/110/112/114 are also deposited onto the upper surface of the compound semiconductor wafer structure to provide appropriate source and drain contacts for the devices. As a practical example, if transistor structure 100 represents an inverter circuit, then Ohmic contact 108 would be a source contact for n-type device 120, Ohmic contact 110 would be a drain contact for n-type device 120, Ohmic contact 112 would be a source contact for p-type device 122, and Ohmic contact 114 would be a drain contact for p-type device 122. Suitable materials for Ohmic contacts 108/110/112/114 are well known in the prior art.

In a practical embodiment, the threshold voltage of n-channel device 120 is positive, and the threshold voltage can be adjusted by appropriate design of epitaxial layer structure 104 and by selection of a suitable material (having a specific work function) for gate electrode 116. The threshold voltage of p-type device 122 is negative, and the threshold voltage can be adjusted by selection of a suitable material for gate electrode 118. In accordance with one practical embodiment, if the threshold voltage of n-channel device 120 is adjusted to 0.3 volts, the threshold voltage of p-channel device 122 is approximately 0.3 volts minus the bandgap of channel layer 132 when using an identical gate metal for both devices. If transistor structure 100 employs an $In_{0.2}Ga_{0.8}As$ channel layer 132 with a bandgap of 1.2 eV, a threshold voltage of −0.9 volts is obtained for p-channel device 122. Further threshold voltage adjustments of p-channel device 122 are disclosed in another embodiment of the invention described below in connection with FIG. 2.

Transistor structure 100 has several advantages, which can be best explained with reference to conventional device structures. Some conventional structures include compound semiconductor enhancement mode metal-oxide-semiconductor field effect transistors that utilize standard refractory metal gates with a metal work function of about 4.6 eV for both n-channel and p-channel devices, an undoped channel to provide positive threshold voltage for the n-channel device and negative threshold voltage for the p-channel device, and self-aligned ion implants to form low resistivity source and drain extensions and Ohmic contact regions for both p-channel and n-channel devices. The advantages of transistor structure 100 over such structures are as follows. The replacement of n-type ion implants by epitaxial donor layers 136/138 in n-channel device 120 reduces the thermal budget and allows the fabrication of functional n-channel MOSFETs and, in turn, the manufacture of a functional complementary technology. The highest processing temperature for devices configured in accordance with the invention is dictated by the required activation temperature of p-type ion implants 126/128 located in p-channel device 122. Acceptor implants such as Mg provide sheet carrier concentrations of up to $10^{14}$ cm$^{-2}$ and above at annealing temperatures as low as 600° C., exceeding the sheet resistance requirements for the access regions of p-channel device 122. Thus, the highest processing temperature falls as much as 100° C. below the maximum temperature for $Ga_2O_3$—GaAs interface preservation.

The activated acceptor ion implants 126/128 over-compensate the negative charge introduced by donor layers 136/138 in the access regions of p-channel device 122. Further, the absence of ion implantation in n-channel device 120 allows for the use of a higher mole fraction of Al in an $Al_xGa_{1-x}As$ spacer layer 134, which can be inserted between gate oxide layer 106 and channel layer 132 due to the absence of DX centers (which typically occur in n-doped $Al_xGa_{1-x}As$ for x>0.2). The use of higher mole fraction $Al_xGa_{1-x}As$ in spacer layer 134 is advantageous because it reduces the effect of border traps, which are located in gate oxide layer 106 close to the oxide-epitaxial layer interface. The use of higher mole fraction $Al_xGa_{1-x}As$ in spacer layer 134 is further advantageous because it provides better electron and hole confinement in n-channel device 120 and p-channel device 122, respectively. Another advantage is the high aspect ratio achievable due to the use of shallow epitaxial donor layers 136/138, which makes transistor structure 100 suitable for deep submicron technologies.

FIG. 2 is a simplified cross sectional view of a metal-oxide-semiconductor field effect transistor structure 200 configured in accordance with an example embodiment of the invention. A number of characteristics and features of transistor structure 200 are identical, similar, or equivalent to transistor structure 100 and, therefore, portions of the above description of transistor structure 100 may also apply to transistor structure 200. Transistor structure 200 generally includes a compound semiconductor substrate 202, an epitaxial layer structure 204 formed on compound semiconductor substrate 202, a gate oxide layer 206, Ohmic contacts (identified by reference numbers 208 and 210), and a gate electrode 212. In one embodiment, transistor structure 200 includes a p-channel device 214 formed on compound semiconductor substrate 202, and utilizes ion implants located in p-channel device 214.

Compound semiconductor substrate 202 is formed from a III-V material such as GaAs, and epitaxial layer structure 204 includes a buffer layer 216 formed on compound semiconductor substrate 202, a channel layer 218 formed on buffer layer 216, and a spacer layer 220 formed on channel layer 218. Transistor structure 200 also includes at least one donor layer formed within epitaxial layer structure 204. FIG. 2 depicts a first donor layer 222 formed within buffer layer 216 and a second donor layer 224 formed within spacer layer 220. As described above, the donor layer(s) establish a natural conductivity type for epitaxial layer structure 204, e.g., n-type conductivity, and ion implantation inverts or reverses the conductivity type. In this regard, transistor structure 200 employs ion implant 226 as shown in FIG. 2.

In the example embodiment, ion implant 226 is realized as a p-type acceptor implant located in p-channel device 214. Ion implant 226 serves to "invert" or "reverse" the natural conductivity type of epitaxial layer structure 204. This conductivity inversion occurs because the ionized acceptor concentration of the implant exceeds the ionized donor concentration provided by the donor layers. In this example, ion implant 226 inverts the n-type conductivity of epitaxial layer structure 204 to form the p-channel device 214. As shown in FIG. 2, ion implant 226 is preferably located under the respective Ohmic contacts 208/210 and in the source and drain extensions. In addition, transistor structure 200 includes a channel implant 228 that is used for threshold voltage adjustment.

As described above in connection with transistor structure 100, the threshold voltage of p-channel device 214 can be adjusted via the work function of the material for gate electrode 212. In addition, the threshold voltage of p-channel device 214 can be adjusted via the recess depth of gate electrode 212, and the dose of acceptor channel implant 228. For example, the p-channel threshold voltage can be easily adjusted to, e.g., −0.3 volts by varying the recess depth of gate electrode 212 and/or by varying the dose of acceptor channel implant 228. When gate electrode 212 is recessed, the performance of p-channel device 214 is also enhanced.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A complementary metal-oxide-semiconductor field effect transistor structure comprising:
    a semiconductor substrate;
    an n-channel device formed on said semiconductor substrate;
    a p-channel device formed on said semiconductor substrate; and
    ion implants located in only one of said n-channel device or said p-channel device, said ion implants also being located under respective source and drain contacts for said one of said n-channel device or said p-channel device.

2. A complementary metal-oxide-semiconductor field effect transistor structure according to claim 1, wherein said ion implants are acceptor implants located in said p-channel device.

3. A complementary metal-oxide-semiconductor field effect transistor structure according to claim 1, wherein said semiconductor substrate is a compound semiconductor substrate.

4. A complementary metal-oxide-semiconductor field effect transistor structure according to claim 1, further comprising:
    an epitaxial layer structure formed on said semiconductor substrate; and
    at least one donor layer formed within said epitaxial layer structure, wherein said ion implants invert the conductivity type of said epitaxial layer structure.

5. A complementary metal-oxide-semiconductor field effect transistor structure according to claim 4, wherein said epitaxial layer structure comprises a buffer layer formed on said semiconductor substrate, a channel layer formed on said buffer layer, and a spacer layer formed on said channel layer.

6. A complementary metal-oxide-semiconductor field effect transistor structure according to claim 5, wherein said at least one donor layer is formed within said buffer layer.

7. A complementary metal-oxide-semiconductor field effect transistor structure according to claim 5, wherein said at least one donor layer is formed within said spacer layer.

8. A complementary metal-oxide-semiconductor field effect transistor structure comprising:
    a semiconductor substrate;
    an epitaxial layer structure formed on said semiconductor substrate;
    at least one dopant layer formed within said epitaxial layer structure, said at least one dopant layer establishing a conductivity type for said epitaxial layer structure;
    an n-channel device formed on said semiconductor substrate;
    a p-channel device formed on said semiconductor substrate; and
    ion implants located in only one of said n-channel device or said p-channel device, said ion implants inverting said conductivity type of said epitaxial layer structure, said ion implants also being located under respective source and drain contacts for said one of said n-channel device or said p-channel device.

9. A complementary metal-oxide-semiconductor field effect transistor structure according to claim 8, wherein said dopant layer comprises donor atoms and said ion implants are acceptor implants located in said p-channel device.

10. A complementary metal-oxide-semiconductor field effect transistor structure according to claim 8, wherein said dopant layer comprises acceptor atoms and said ion implants are donor implants located in said n-channel device.

11. A complementary metal-oxide-semiconductor field effect transistor structure according to claim 8, wherein said epitaxial layer structure comprises a buffer layer formed on said semiconductor substrate, a channel layer formed on said buffer layer, and a spacer layer formed on said channel layer.

12. A complementary metal-oxide-semiconductor field effect transistor structure according to claim 11, wherein said at least one dopant layer is formed within said buffer layer.

13. A complementary metal-oxide-semiconductor field effect transistor structure according to claim 11, wherein said at least one dopant layer is formed within said spacer layer.

14. A complementary metal-oxide-semiconductor field effect transistor structure according to claim 11, wherein said at least one dopant layer comprises a first donor layer formed within said buffer layer and a second donor layer formed within said spacer layer.

15. A complementary metal-oxide-semiconductor field effect transistor structure according to claim 8, wherein said semiconductor substrate is a compound semiconductor substrate.

16. A complementary metal-oxide-semiconductor field effect transistor structure comprising:
   a semiconductor substrate;
   an n-channel device formed on said semiconductor substrate;
   a p-channel device formed on said semiconductor substrate; and
   ion implants located in only one of said n-channel device or said p-channel device, said ion implants being acceptor implants located in said p-channel device.

17. A complementary metal-oxide-semiconductor field effect transistor structure comprising:
   a compound semiconductor substrate;
   an n-channel device formed on said semiconductor substrate;
   a p-channel device formed on said semiconductor substrate; and
   ion implants located in only one of said n-channel device or said p-channel device.

18. A complementary metal-oxide-semiconductor field effect transistor structure comprising:
   a semiconductor substrate;
   an epitaxial layer structure formed on said semiconductor substrate, said epitaxial layer structure comprising a buffer layer formed oil said semiconductor substrate, a channel layer formed on said buffer layer, and a spacer layer formed on said channel layer;
   at least one donor layer formed within said epitaxial layer structure;
   an n-channel device formed on said semiconductor substrate;
   a p-channel device formed on said semiconductor substrate; and
   ion implants located in only one of said n-channel device or said p-channel device, wherein said ion implants invert the conductivity type of said epitaxial layer structure.

19. A complementary metal-oxide-semiconductor field effect transistor structure comprising:
   a semiconductor substrate;
   an epitaxial layer structure formed on said semiconductor substrate;
   at least one dopant layer formed within said epitaxial layer structure, said at least one dopant layer establishing a conductivity type for said epitaxial layer structure, and said at least one dopant layer comprising acceptor atoms;
   an n-channel device formed on said semiconductor substrate;
   a p-channel device formed on said semiconductor substrate; and
   ion implants located in only one of said n-channel device or said p-channel device, said ion implants inverting said conductivity type of said epitaxial layer structure, and said ion implants being donor implants located in said n-channel device.

20. A complementary metal-oxide-semiconductor field effect transistor structure comprising:
   a semiconductor substrate;
   an epitaxial layer structure formed on said semiconductor substrate, said epitaxial layer structure comprising a buffer layer formed on said semiconductor substrate, a channel layer formed oil said buffer layer, and a spacer layer formed on said channel layer;
   at least one dopant layer formed within said epitaxial layer structure, said at least one dopant layer establishing a conductivity type for said epitaxial layer structure;
   an n-channel device formed on said semiconductor substrate;
   a p-channel device formed on said semiconductor substrate; and
   ion implants located in only one of said n-channel device or said p-channel device, said ion implants inverting said conductivity type of said epitaxial layer structure.

21. A complementary metal-oxide-semiconductor field effect transistor structure comprising:
   a compound semiconductor substrate;
   an epitaxial layer structure formed on said semiconductor substrate;
   at least one dopant layer formed within said epitaxial layer structure, said at least one dopant layer establishing a conductivity type for said epitaxial layer structure;
   an n-channel device formed on said semiconductor substrate;
   a p-channel device formed on said semiconductor substrate; and
   ion implants located in only one of said n-channel device or said p-channel device, said ion implants inverting said conductivity type of said epitaxial layer stricture.

* * * * *

UNITED STATES PATENT AND TRADEMARK OFFICE
CERTIFICATE OF CORRECTION

| | |
|---|---|
| PATENT NO. | : 7,119,381 B2 |
| APPLICATION NO. | : 10/903784 |
| DATED | : October 10, 2006 |
| INVENTOR(S) | : Passlack |

Page 1 of 1

It is certified that error appears in the above-identified patent and that said Letters Patent is hereby corrected as shown below:

Column 7, line 51, "oil" should be changed to --on--;
Column 8, line 29, "oil" should be changed to --on--.

Signed and Sealed this

Twenty-sixth Day of June, 2007

JON W. DUDAS
*Director of the United States Patent and Trademark Office*